US010812010B2

United States Patent
Saito et al.

(10) Patent No.: US 10,812,010 B2
(45) Date of Patent: Oct. 20, 2020

(54) MOUNTING STRUCTURE FOR PHOTOVOLTAIC POWER GENERATION MODULE, PHOTOVOLTAIC POWER GENERATION MODULE, PHOTOVOLTAIC POWER GENERATION PANEL, AND PHOTOVOLTAIC POWER GENERATION DEVICE

(71) Applicant: Sumitomo Electric Industries, Ltd., Osaka-shi (JP)

(72) Inventors: Kenji Saito, Osaka (JP); Kazumasa Toya, Osaka (JP); Koji Mori, Osaka (JP); Masao Moriguchi, Osaka (JP); Hiroyuki Konaka, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 51 days.

(21) Appl. No.: 16/319,011

(22) PCT Filed: Jul. 10, 2017

(86) PCT No.: PCT/JP2017/025150
§ 371 (c)(1),
(2) Date: Jan. 18, 2019

(87) PCT Pub. No.: WO2018/030054
PCT Pub. Date: Feb. 15, 2018

(65) Prior Publication Data
US 2019/0238086 A1    Aug. 1, 2019

(30) Foreign Application Priority Data
Aug. 8, 2016    (JP) ................................ 2016-155699

(51) Int. Cl.
*H02N 6/00*    (2006.01)
*H01L 31/042*    (2014.01)
(Continued)

(52) U.S. Cl.
CPC .............. *H02S 20/10* (2014.12); *H02S 20/32* (2014.12); *H02S 30/10* (2014.12); *H02S 40/22* (2014.12)

(58) Field of Classification Search
CPC .......... H02S 20/23; H02S 20/32; H02S 20/10; H02S 30/10
See application file for complete search history.

(56) References Cited

U.S. PATENT DOCUMENTS

| 4,966,631 A | 10/1990 | Matlin et al. | |
| 2011/0240006 A1* | 10/2011 | Linke | H02S 20/23 |
| | | | 126/600 |

(Continued)

FOREIGN PATENT DOCUMENTS

| JP | 2011-196067 A | | 10/2011 |
| JP | 2012182323 A | * | 9/2012 |
| JP | 2013-084670 A | | 5/2013 |

OTHER PUBLICATIONS

English machine translation of JP 2012-182323 A (Year: 2020).*

*Primary Examiner* — Angelo Trivisonno
(74) *Attorney, Agent, or Firm* — Baker Botts L.L.P.; Michael A. Sartori

(57) ABSTRACT

A mounting structure for a photovoltaic module, the photovoltaic module including: a plurality of power generating elements; and a housing having a metal bottom plate on which the plurality of power generating elements are arrayed, and a resin side wall frame standing along an outer edge of the bottom plate, the mounting structure including: a support plate having a support face configured to be in contact with an outer face of the bottom plate to support the photovoltaic module; a washer to be disposed on one face which is an inner face of the bottom plate or a face, of the support plate, at a side opposite to the support face; and a rivet having a shank portion and a head, the shank portion (Continued)

being configured to be passed through the support plate and the bottom plate to be inserted into the washer, the head formed at one end portion of the shank portion, the rivet being configured to sandwich and fasten the support plate and the bottom plate between the washer and the head by an other end portion of the shank portion being deformed so as to have an enlarged diameter.

7 Claims, 10 Drawing Sheets

(51) Int. Cl.
*H02S 20/10* (2014.01)
*H02S 30/10* (2014.01)
*H02S 20/32* (2014.01)
*H02S 40/22* (2014.01)

(56) References Cited

U.S. PATENT DOCUMENTS

| | | |
|---|---|---|
| 2011/0265860 A1* | 11/2011 | Ciasulli .................. F24S 25/65 136/251 |
| 2013/0056595 A1 | 3/2013 | Tomlinson |
| 2014/0251413 A1 | 9/2014 | Parras Padilla et al. |
| 2014/0290720 A1 | 10/2014 | Hockaday |

* cited by examiner

MOUNTING STRUCTURE FOR PHOTOVOLTAIC POWER GENERATION MODULE, PHOTOVOLTAIC POWER GENERATION MODULE, PHOTOVOLTAIC POWER GENERATION PANEL, AND PHOTOVOLTAIC POWER GENERATION DEVICE

TECHNICAL FIELD

The present invention relates to a mounting structure for a photovoltaic module, a photovoltaic module, a photovoltaic panel, and a photovoltaic apparatus.

This application claims priority based on Japanese Patent Application No. 2016-155699 filed on Aug. 8, 2016, the entire contents of which are incorporated herein by reference.

BACKGROUND ART

For example, in concentrating-type photovoltaic power generation in which the sun is tracked, a basic configuration is employed in which sun light concentrated through lenses is applied to power generating elements which are composed of small compound semiconductor elements and the like each having a high power generation efficiency. A photovoltaic module is obtained by arranging a large number of such basic units in a matrix shape in one housing. A photovoltaic panel is obtained by further arranging a plurality of the modules. This photovoltaic panel, together with a driving device which causes the panel to perform tracking operation while facing the sun, forms a photovoltaic apparatus.

As a housing used in the above-mentioned photovoltaic module, there is a housing that includes: a bottom plate where a plurality of power generating elements are arrayed; and a frame body standing along the outer edge of the bottom plate and holding a concentrating member so as to face the bottom plate.

In such a housing, in some cases, the frame body (excluding the bottom plate) is formed from resin in order to reduce the weight and the cost (for example, see PATENT LITERATURE 1).

CITATION LIST

Patent Literature

PATENT LITERATURE 1: Japanese Laid-Open Patent Publication No. 2013-84670
PATENT LITERATURE 2: US Patent Application Publication No. US 2014/0251413 A1

SUMMARY OF INVENTION

A mounting structure for a photovoltaic module of the present disclosure is a mounting structure for a photovoltaic module that includes: a plurality of power generating elements; and a housing having a metal bottom plate on which the plurality of power generating elements are arrayed, and a resin side wall frame standing along an outer edge of the bottom plate. The mounting structure includes: a support plate having a support face configured to be in contact with an outer face of the bottom plate to support the photovoltaic module; a washer to be disposed on one face which is an inner face of the bottom plate or a face, of the support plate, at a side opposite to the support face; and a rivet having a shank portion and a head, the shank portion being configured to be passed through the support plate and the bottom plate to be inserted into the washer, the head formed at one end portion of the shank portion, the rivet being configured to sandwich and fasten the support plate and the bottom plate between the washer and the head by an other end portion of the shank portion being deformed so as to have an enlarged diameter.

A photovoltaic module of the present disclosure has the mounting structure described above used therefor.

A photovoltaic panel of the present disclosure is a photovoltaic panel formed with a plurality of the photovoltaic modules described above being arranged.

A photovoltaic apparatus of the present disclosure is a photovoltaic apparatus including: the photovoltaic panel described above; and a driving device configured to drive the photovoltaic panel so as to perform operation of tracking movement of the sun while facing a direction of the sun.

DESCRIPTION OF EMBODIMENTS

Problems to be Solved by the Present Disclosure

Inside the above conventional photovoltaic module, since a large number of power generating elements are connected in series, a high voltage occurs. Therefore, for safety, the bottom plate (metal) located immediately below electric circuits needs to be grounded. If the entire housing is formed from metal, it is easy to ground any portion of the housing. However, if the frame body other than the bottom plate is formed from resin, it is not easy to ground compared with a case where the entire housing is formed from metal.

Figure 10:
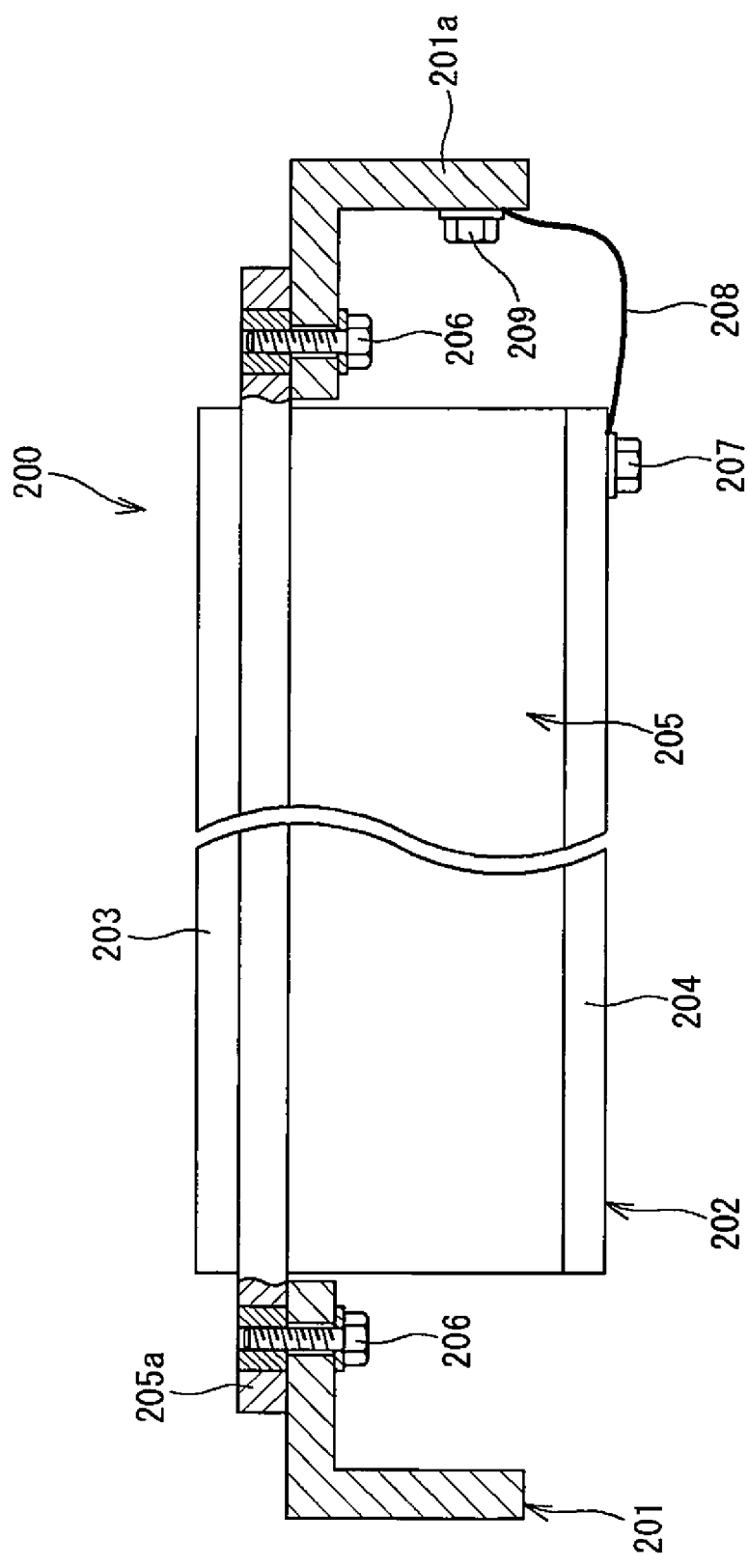
FIG. 10 is a diagram showing one example of a structure in which a conventional photovoltaic module is mounted to a pedestal of a photovoltaic apparatus.

FIG. 10 is a diagram showing one example of a structure in which a module that uses a housing that includes: a frame body formed from resin; and a bottom plate formed from metal, is mounted to a pedestal of a photovoltaic apparatus.

In FIG. 10, a photovoltaic module 200 is fixed to a pedestal 201 of the photovoltaic apparatus. The photovoltaic module 200 includes: a housing 202; and a concentrating portion 203 covering the opening of the housing 202.

The housing 202 includes: a metal bottom plate 204 on which power generating elements (not shown) are arrayed; and a resin frame body 205.

A flange portion 205a protruding from the outer face of the frame body 205 is fastened to the pedestal 201 by means of bolts 206, whereby the photovoltaic module 200 of this example is fixed to the pedestal 201.

A bolt 207 is mounted to the outer face of the bottom plate 204. The bolt 207 fixes a conductor line 208 to the bottom plate 204.

One end portion of the conductor line 208 is sandwiched by the bolt 207 and the bottom plate 204. The other end portion of the conductor line 208 is sandwiched by a bolt 209 mounted to a side plate portion 201a of the pedestal 201 and the side plate portion 201a.

The conductor line 208 electrically connects the bottom plate 204 and the pedestal 201 to each other. The pedestal 201 is connected to another member having conductivity, and the bottom plate 204 is grounded through the conductor line 208 and the pedestal 201.

As described above, in a case where the frame body 205 of the housing 202 is formed from resin, it is conceivable that: the bottom plate 204 is formed from metal; and the bottom plate 204 and a conductor outside the housing 202 are electrically connected to each other by the conductor line 208.

However, in a case where the module 200 having the above configuration is to be fixed to a photovoltaic apparatus, when the module 200 is to be fastened to the pedestal 201 by means of the bolts 206, it is necessary to manage the fastening torque of the bolts 206, and in addition, it is further necessary to perform work of connecting the conductor line 208, which results in complicated work. Further, there are cases where a large number of modules 200 are fixed to the pedestal 201, which requires repetition of such complicated work many times and a lot of man-hours.

Thus, there are desires for measures that facilitate the work of mounting the module 200 to a photovoltaic apparatus.

Thus, an object of the present disclosure is to facilitate mounting work of a photovoltaic module to a power generation apparatus.

Effects of the Present Disclosure

According to the present disclosure, mounting work of a photovoltaic module to a power generation apparatus can be facilitated.

Description of Embodiments of the Present Disclosure

First, contents of an embodiment of the present disclosure are listed and described.

(1) A mounting structure for a photovoltaic module according to an embodiment of the present disclosure is a mounting structure for a photovoltaic module that includes: a plurality of power generating elements; and a housing having a metal bottom plate on which the plurality of power generating elements are arrayed, and a resin side wall frame standing along an outer edge of the bottom plate. The mounting structure includes: a support plate having a support face configured to be in contact with an outer face of the bottom plate to support the photovoltaic module; a washer to be disposed on one face which is an inner face of the bottom plate or a face, of the support plate, at a side opposite to the support face; and a rivet having a shank portion and a head, the shank portion being configured to be passed through the support plate and the bottom plate to be inserted into the washer, the head formed at one end portion of the shank portion, the rivet being configured to sandwich and fasten the support plate and the bottom plate between the washer and the head by an other end portion of the shank portion being deformed so as to have an enlarged diameter.

According to the mounting structure for the photovoltaic module, the shank portion of the rivet, which is passed through the support plate and the bottom plate of the housing and inserted into the washer, is deformed so as to have an enlarged diameter by use of a general-purpose tool. As a result, the support plate and the bottom plate can be sandwiched and fastened between the head of the rivet and the washer. Accordingly, the photovoltaic module can be fixed to the support plate. Thus, unlike the conventional example mentioned above, it is not necessary to manage the fastening torque of bolts that fix the module, and the mounting work of the photovoltaic module to the power generation apparatus can be facilitated.

(2) In the mounting structure for the photovoltaic module, preferably, the support plate is an electric conductor that is grounded, and the rivet and the washer are each an electric conductor that serves as a path for electrical connection from the bottom plate to the support plate.

In this case, if the photovoltaic module is fixed to the support plate by use of the rivet and the washer, the rivet and the washer serve as the path for electrical connection from the bottom plate to the support plate at the same time. Accordingly, grounding for the bottom plate can also be ensured. Thus, unlike the conventional example mentioned above, it is not necessary to perform work of connecting a conductor line for providing grounding after the module is fixed, and thus, the mounting work of the photovoltaic module to the power generation apparatus can be further facilitated.

(3) In the mounting structure for the photovoltaic module, preferably, the washer is disposed such that positional adjustment thereof is allowed on the one face.

In this case, if the through-holes, of the bottom plate and the support plate, through which the shank portion of the rivet is passed, are each formed so as to have a hole diameter that allows the shank portion to be inserted with a play, there are cases where the position at which the shank portion is inserted into the washer at the one face side is displaced. However, even in such a case, if positional adjustment of the washer is performed at the one face, the shank portion of the rivet can be assuredly inserted into the washer.

(4) In the mounting structure for the photovoltaic module, preferably, the washer is disposed at a predetermined portion in the inner face of the bottom plate, and an end portion at the bottom plate side of the side wall frame forms a recessed portion which is recessed to an inner side of the housing such that the predetermined portion is located at an outer side of the side wall frame.

In this case, when the shank portion of the rivet is deformed so as to have an enlarged diameter, even if the washer is forgotten to be inserted into the shank portion, the washer can be easily inserted into the shank portion of the rivet by inserting the washer to the recessed portion from the outer side of the side wall frame.

(5) In the mounting structure for the photovoltaic module, preferably, a seal layer for sealing an inside of the housing is formed between the end portion at the bottom plate side of the side wall frame and the bottom plate.

In this case, foreign matter such as water, dust, and the like can be inhibited from entering the inside of the housing from the recessed portion formed at the outer side of the side wall frame.

(6) A photovoltaic module according to an embodiment of the present disclosure has the mounting structure according to (1) above used therefor.

In this case, the same effects as those obtained in (1) above can be exhibited.

(7) A photovoltaic panel according to an embodiment of the present disclosure is formed with a plurality of the photovoltaic modules according to (6) above being arranged.

The photovoltaic panel can realize desired power generation.

(8) A photovoltaic apparatus according to an embodiment of the present disclosure includes: the photovoltaic panel according to (7) above; and a driving device configured to drive the photovoltaic panel so as to perform operation of tracking movement of the sun while facing a direction of the sun.

In this case, it is possible to provide a photovoltaic apparatus that always maintains, during daytime, the state where the power generation efficiency is highest at that point in time.

Details of Embodiments of the Present Disclosure

Hereinafter, an embodiment of the present disclosure is described in detail with reference to the attached drawings. It should be noted that at least parts of the embodiment described below may be combined as desired.

<Photovoltaic Apparatus and Photovoltaic Panel>

Figure 1:
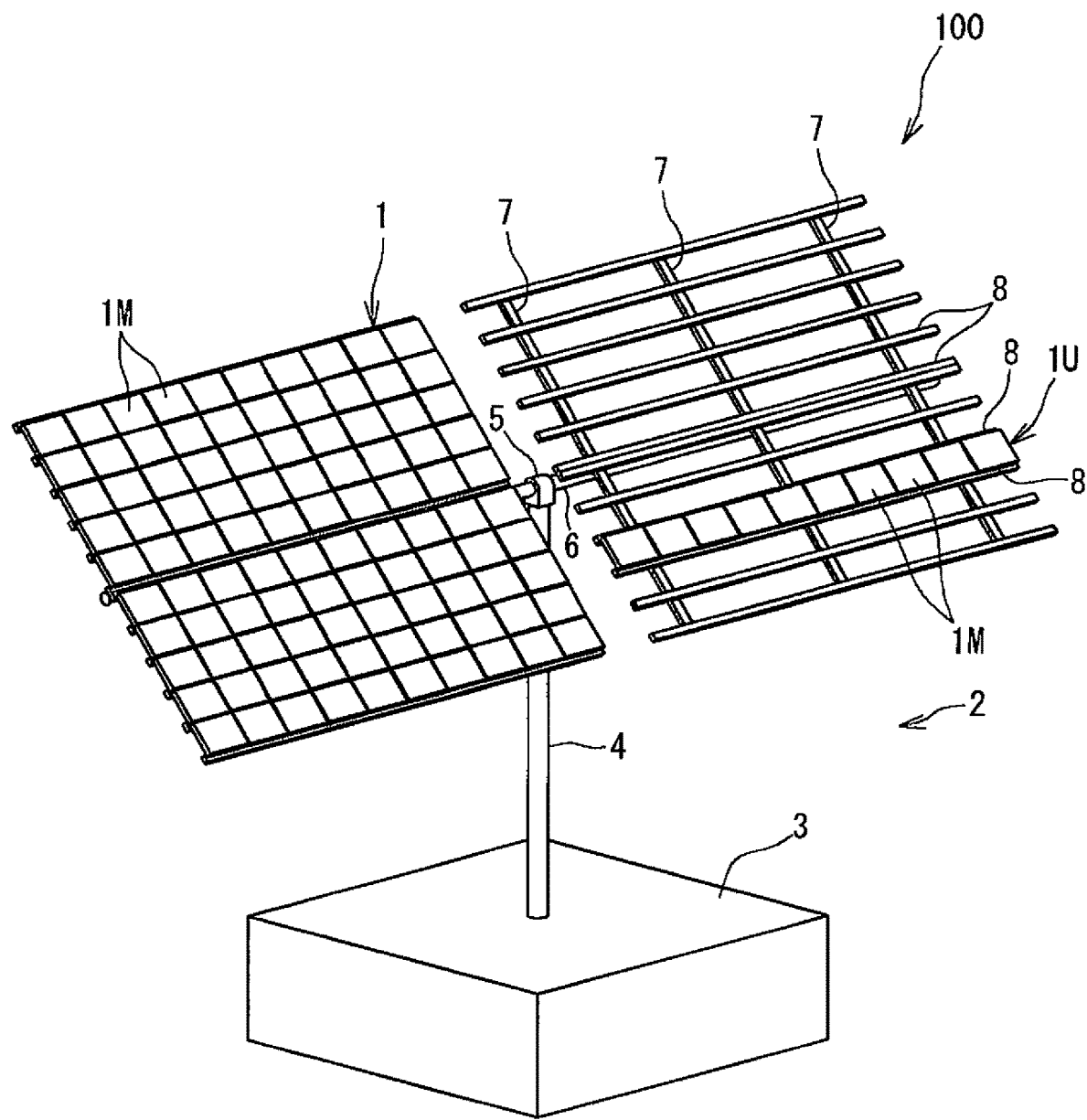
FIG. 1 is a perspective view showing one example of a photovoltaic apparatus.

First, a configuration of a photovoltaic apparatus is described. FIG. 1 is a perspective view showing one example of a concentrator photovoltaic apparatus. In FIG. 1, a photovoltaic apparatus 100 includes: a photovoltaic panel 1 composed of two panels, i.e., left wing and right wing; and a pedestal 2 which supports the photovoltaic panel 1 at the rear face side thereof. In FIG. 1, with respect to the panel 1 at the right side on the drawing sheet, a part of the photovoltaic panel 1 is omitted in order to show the structure of the pedestal 2.

The pedestal 2 includes: a base 3; and a support portion 4 standing on the base 3. The base 3 is fixed to the ground. The support portion 4 is vertically provided. A driving device 5, which drives the photovoltaic panel 1 so as to perform operation of tracking the movement of the sun while facing the direction of the sun, is provided at the support point for the photovoltaic panel 1. The support point is at the upper end of the support portion 4. Specifically, the driving device 5 drives the photovoltaic panel 1 so as to rotate in the elevation direction about a horizontally extending shaft 6. In addition, the driving device 5 drives the photovoltaic panel 1 so as to rotate in the azimuth direction about the support portion 4.

The driving device 5 is controlled by a control device (not shown). The control device has a drive circuit for driving built-in motors of the driving device 5. Through the operation of the motor (stepping motor) for each axis, the photovoltaic panel 1 can take an attitude at any angle for each of the azimuth and the elevation.

The shaft 6 driven by the driving device 5 is provided with a plurality of beams 7 in a direction perpendicular to the shaft 6. The photovoltaic panel 1 is fixed to the upper side of the plurality of beams 7. The photovoltaic panel 1 is formed by arraying, in multiple rows, units 1U each formed by arranging 10 photovoltaic modules 1M horizontally in a row, for example.

Each unit 1U includes: a plurality of photovoltaic modules 1M; and a pair of frames 8 which integrally fix these photovoltaic modules 1M in a state of being aligned in a line. Each unit 1U is extended over the beams 7 and is fixed to the upper side of the beams 7.

Each wing of the photovoltaic panel 1 is composed of 10 units 1U, for example. Accordingly, each wing of the photovoltaic panel 1 is formed by arranging 10 (in length)× 10 (in breadth) photovoltaic modules 1M in a matrix shape. Accordingly, 200 photovoltaic modules 1M are present in the photovoltaic panel 1 having the two wings.

<Photovoltaic Module>

Figure 2:
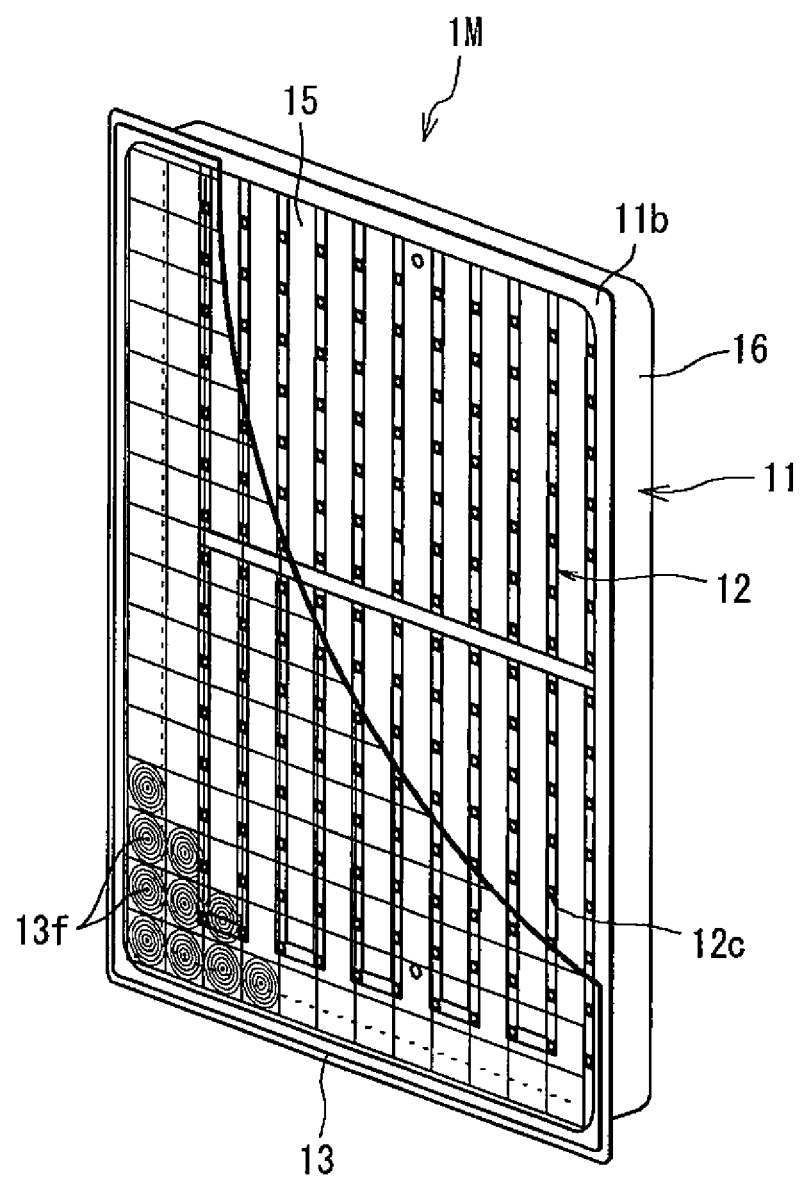
FIG. 2 is an enlarged perspective view of a photovoltaic module according to one embodiment of the present invention.

FIG. 2 is an enlarged perspective view (with a concentrating portion 13 partially cut out) showing a concentrator photovoltaic module (hereinafter, also simply referred to as module) 1M according to one embodiment of the present disclosure. In FIG. 2, the module 1M includes, as major components: a housing 11 in a box shape; a flexible printed circuit 12 arranged in a plurality of rows at a bottom plate 15 of the housing 11; and a concentrating portion 13 mounted, like a cover, at a flange portion 11b of the housing 11.

The flexible printed circuit 12 is obtained by providing a strip-film-shaped insulating base material with an electric conductor layer forming a circuit pattern. On top of this, power generating elements (solar cells) 12c and other electronic components are mounted. As each power generating element 12c, a solar battery having heat resistance and a high power generation efficiency is used.

The housing 11 includes: the bottom plate 15 where the flexible printed circuit 12 is disposed; and a side wall frame 16 to which an outer edge portion and the like of the bottom plate 15 are mounted and which holds the concentrating portion 13 so as to face the bottom plate 15. The housing 11 will be described later in detail.

The concentrating portion 13 is a Fresnel lens array and is formed by arranging, in a matrix shape, a plurality (for example, 16 in length×12 in breadth, 192 in total) of Fresnel lenses 13f as lens elements which each concentrates sun light. The concentrating portion 13 can be obtained by, for example, forming a silicone resin film at a back surface of a glass plate as a base material. Each Fresnel lens 13f is formed at this resin film. The total number and arrangement of the Fresnel lenses 13f are the same as the total number and arrangement of the power generating elements 12c, and the Fresnel lenses 13f and the power generating elements 12c are in one-to-one correspondence so that their optical axes are aligned with each other.

Figure 3:
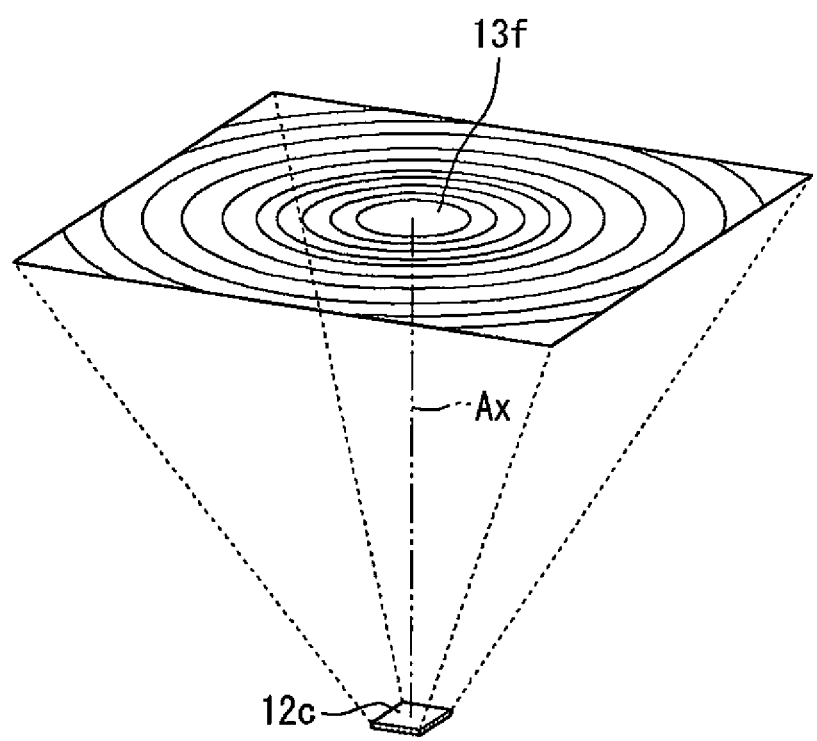
FIG. 3 is a perspective view showing the optical relationship between a Fresnel lens and a power generating element.

FIG. 3 is a perspective view showing the optical relationship between one Fresnel lens 13f and one power generating element 12c. The optical axis Ax of the Fresnel lens 13f passes through the center of the power generating element 12c. When sun light is incident on the Fresnel lens 13f at an incidence angle of 0 degrees, light having been converged by the Fresnel lens 13f is concentrated at the power generating element 12c and the power generating element 12c generates power. During daytime, if the photovoltaic panel 1 (FIG. 1) accurately tracks the sun, such optical relationship is always established, whereby power generation is efficiently performed.

<Mounting Structure for Housing>

Figure 4:
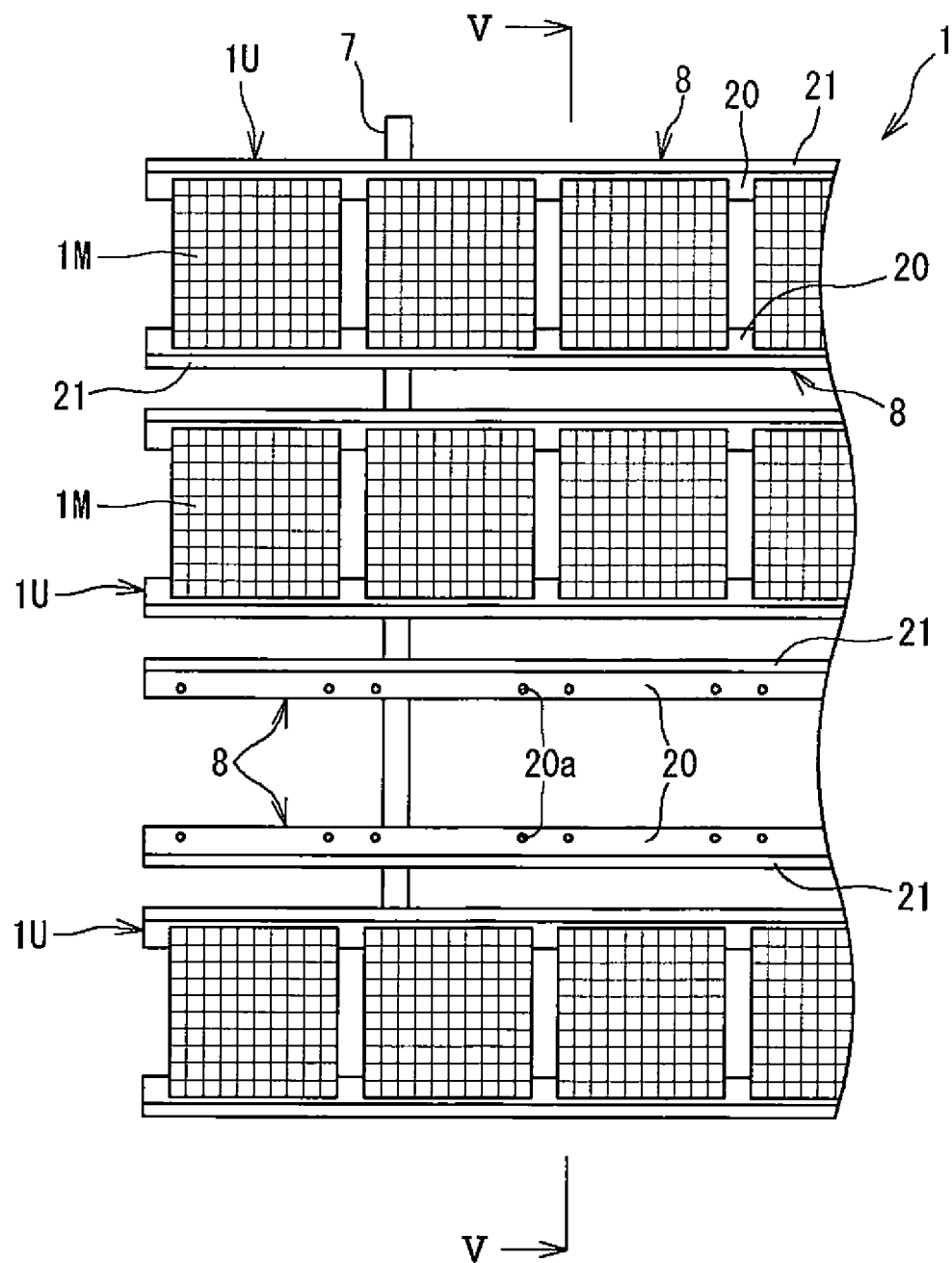
FIG. 4 is a partial top view of a photovoltaic panel shown in FIG. 1.

FIG. 4 is a partial top view of the photovoltaic panel 1 shown in FIG. 1.

As described above, a plurality of the units 1U forming the photovoltaic panel 1 each include: a plurality of the modules 1M; and a pair of the frames 8 integrally fixing the plurality of the modules 1M in a state of being aligned in a line.

Each of the pair of the frames 8 is a long member extending in the horizontal direction, and is formed from an electric conductor such as structural steel, an aluminium alloy, or the like.

The modules 1M are arranged in a line at a predetermined interval, between the pair of the frames 8, and are fixed to the pair of the frames 8.

The length and breadth dimensions and the shape of each module 1M do not reflect those shown in FIG. 2, and are expressed in a simplified manner as one example.

The modules 1M are fixed to the pair of the frames 8, whereby forming a unit 1U.

Each unit 1U is provided so as to be extended over the beams 7 such that the longitudinal direction of the unit 1U is parallel to the horizontal direction, and the unit 1U is fixed to the beams 7. Each unit 1U is fixed to the beams 7 as a result of the frames 8 and the beams 7 being fixed to each other. In this manner, each module 1M is supported and fixed by the frames 8 which are fixed to the beams 7.

Figure 5:
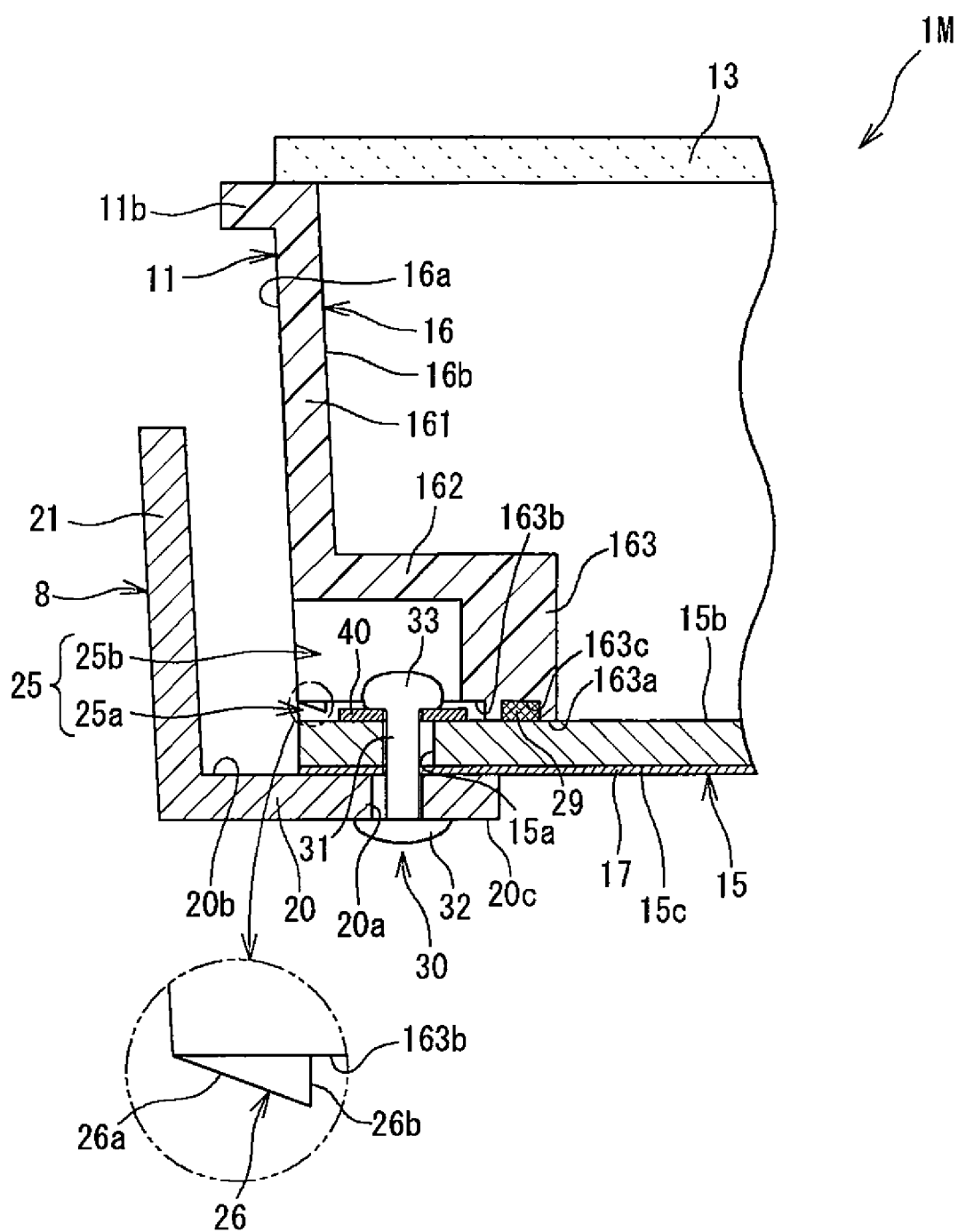
FIG. 5 is a cross-sectional view showing a main part along a line V-V shown in FIG. 4.

FIG. 5 is a cross-sectional view showing a main part along a line V-V shown in FIG. 4.

With reference to FIG. 4 and FIG. 5, the frame 8 is a member having an L-shaped cross-section, for example. The frame 8 includes: a horizontal plate portion 20 being in contact with the bottom plate 15 of the module 1M; and a vertical plate portion 21 standing along the outer edge of the horizontal plate portion 20.

The vertical plate portion 21 is formed so as to extend along an outer face 16a of the side wall frame 16 of the module 1M disposed between the pair of the frames 8.

The vertical plate portion 21 is formed such that an appropriate gap is provided between the vertical plate portion 21 and the outer face 16a. The vertical plate portion 21 has a function as a guide that aligns the modules 1M in the longitudinal direction of the frame 8 when the modules 1M are fixed to the frames 8.

The horizontal plate portion 20 of each of the pair of the frames 8 is in contact with an outer face 15c of the bottom plate 15, thereby supporting the modules 1M while aligning the modules 1M in the longitudinal direction of the frame 8.

In this manner, the horizontal plate portion 20 of each of the pair of the frames 8 constitutes a support plate which supports the modules 1M, and the upper face of the horizontal plate portion 20 serves as a support face 20b which supports the modules 1M.

In the housing 11 of the module 1M, the bottom plate 15 is formed from metal such as an aluminium alloy, and the side wall frame 16 is formed from resin, for example. Thus, with respect to the housing 11 of the present embodiment, the bottom plate 15 and the side wall frame 16 are formed as separate members, and the housing 11 is assembled by the bottom plate 15 and the side wall frame 16 being fixed to each other.

The side wall frame 16 is formed in a rectangular frame shape by use of PBT (Poly Butylene Terephtalate) resin loaded with glass fibers, for example. The concentrating portion 13 is fixed to the opening at the one-side end face of the side wall frame 16. The bottom plate 15 is fixed to the side wall frame 16 so as to close the opening at the other-side end face of the side wall frame 16.

The bottom plate 15 and the side wall frame 16 are fixed by use of bolts and a sealing agent having a bonding effect, and the sealing agent prevents water and dust from entering the inside of the housing 11 through the joining portion between the bottom plate 15 and the side wall frame 16.

Figure 7:
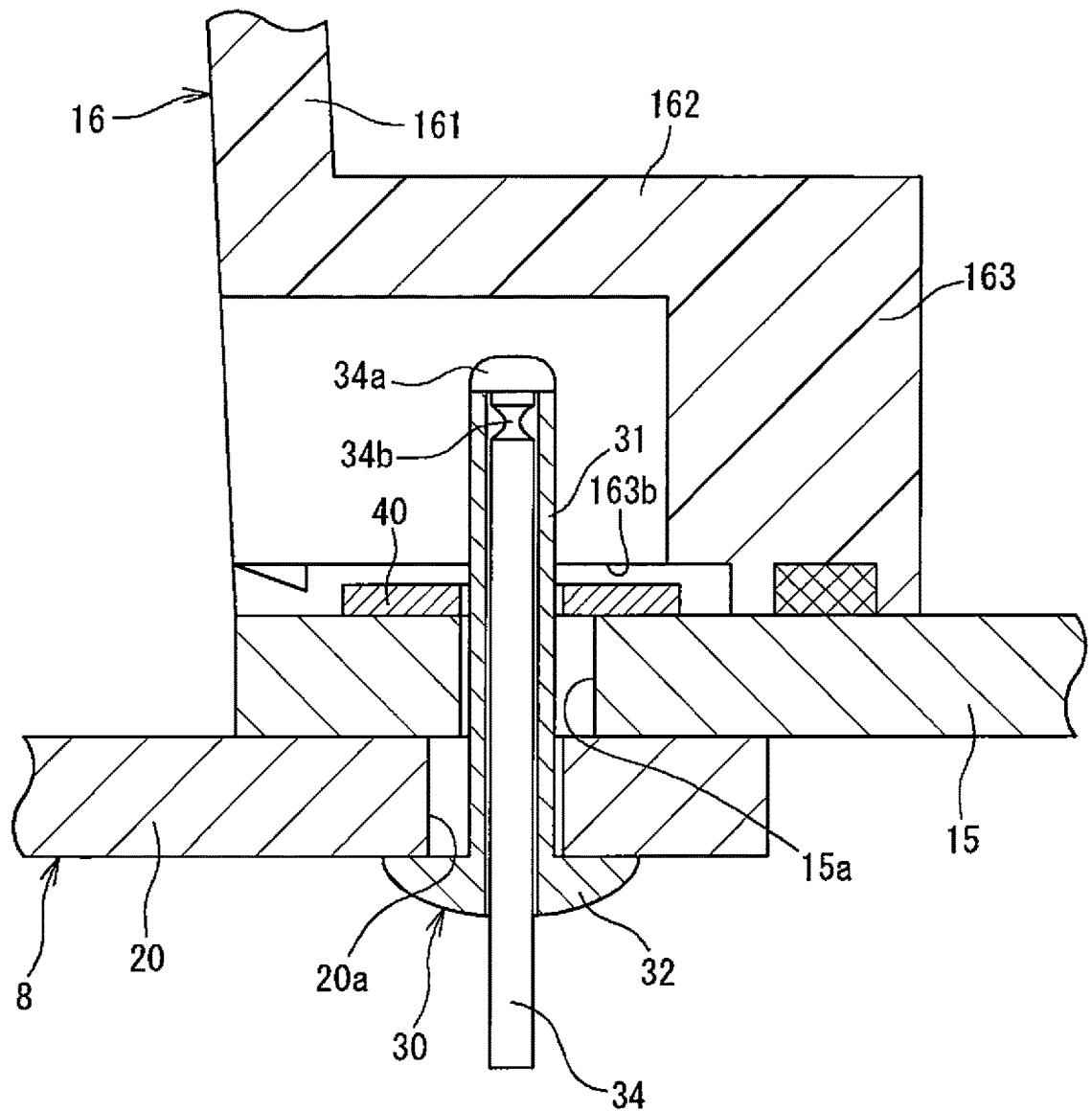
FIG. 7 is a cross-sectional view showing a state in which a rivet is inserted into through-holes of a frame and a bottom plate.
Figure 8:
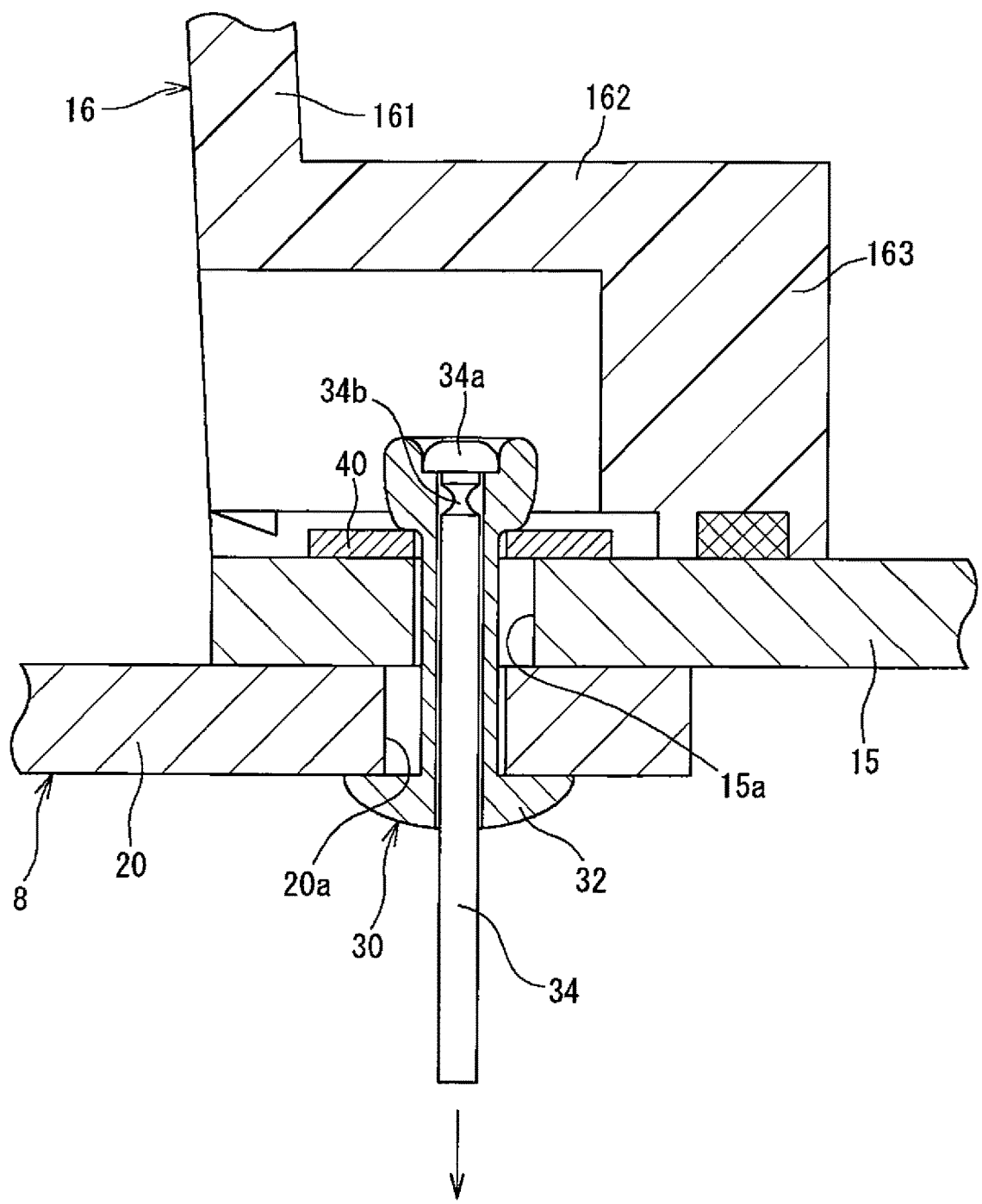
FIG. 8 is a cross-sectional view showing a state in which the leading end portion of the shank portion of the rivet is being deformed so as to have an enlarged diameter.
Figure 9:
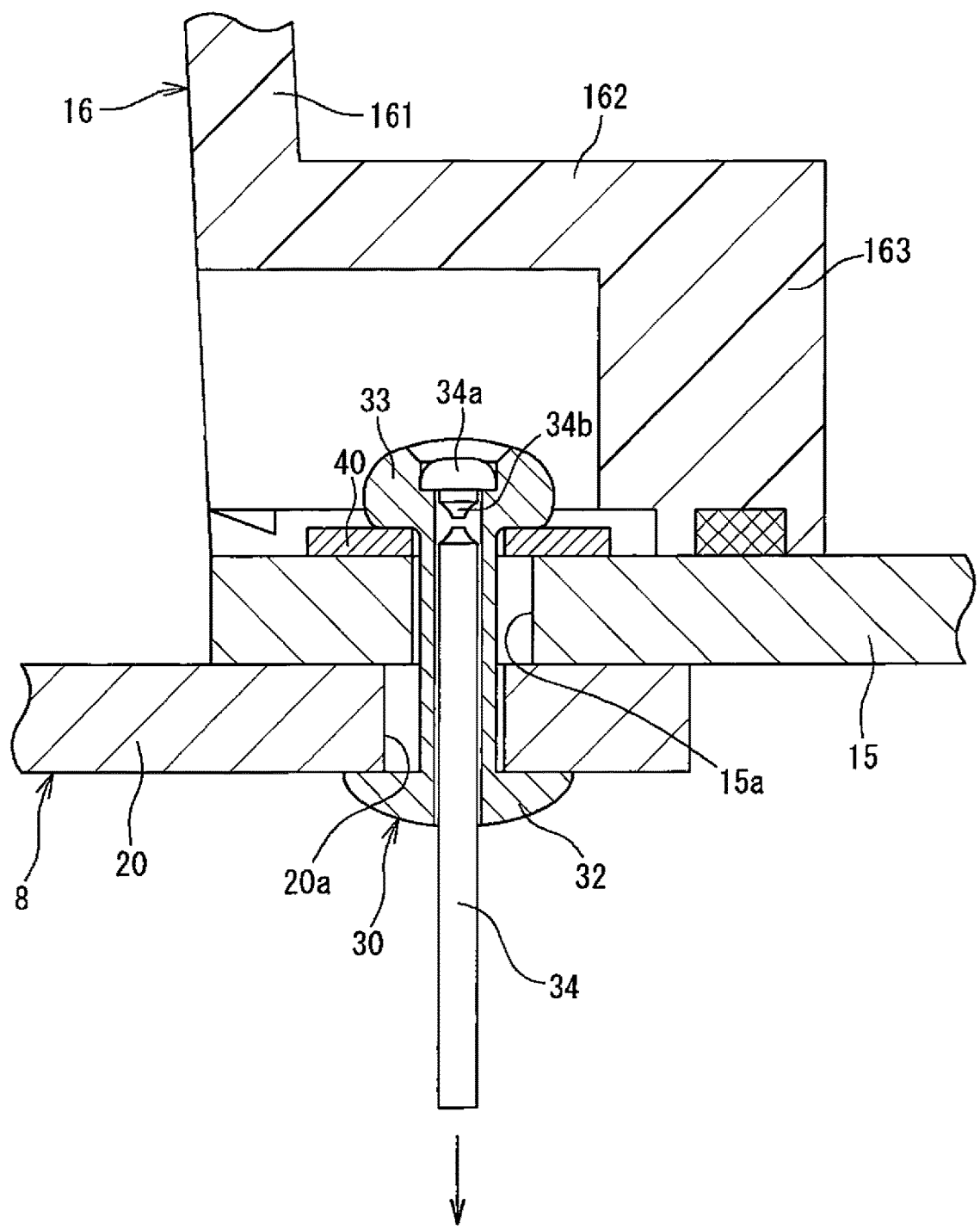
FIG. 9 is a cross-sectional view showing a state in which an enlarged diameter portion has been formed in the leading end portion of the head of the rivet.

In addition, a rust prevention film 17 is formed at the outer face 15c of the bottom plate 15 as a result of rust prevention treatment being performed thereon. In FIG. 7 to FIG. 9 described later, the rust prevention film 17 is not shown.

<Rivet and Washer>

The bottom plate 15 of the housing 11 is fastened to the horizontal plate portions 20 of the frames 8 by means of rivets 30 and washers 40. Each module 1M is fixed to the frames 8 as a result of the horizontal plate portions 20 and the bottom plate 15 being fastened by the rivets 30 and the washers 40.

Each rivet 30 and each washer 40 are a general rivet and a general washer which are formed from an electric conductor such as an aluminium alloy or stainless steel. The rivet 30 and the washer 40 are mounted at each of four corners of the bottom plate 15. The washers 40 of the present embodiment are each a plain washer having an annular plate shape, for example, and are disposed at predetermined portions (four corners) in an inner face 15b of the bottom plate 15.

The rivet 30 has: a shank portion 31 passed through the horizontal plate portion 20 and the bottom plate 15 and inserted into the washer 40; and a head 32 formed at one end portion of the shank portion 31. The head 32 is in contact with a lower face 20c (the face at the side opposite to the support face 20b) of the horizontal plate portion 20.

The shank portion 31 is formed in a cylindrical shape (see FIG. 7). At the other end portion of the shank portion 31, an enlarged diameter portion 33, which is obtained by deforming the other end portion so as to have an enlarged diameter, is formed. The enlarged diameter portion 33 is caulked to be fixed to the washer 40. Accordingly, the bottom plate 15 and the horizontal plate portion 20 are fastened between the head 32 of the rivet 30 and the washer 40, whereby the bottom plate 15 is fixed to the horizontal plate portion 20.

In the bottom plate 15 of the module 1M, through-holes 15a each for allowing the shank portion 31 of the rivet 30 to pass therethrough are formed. The through-holes 15a are formed at four corners in the housing 11, for example.

Also in the horizontal plate portion 20 of each frame 8, through-holes 20a each for allowing the shank portion 31 of the rivet 30 to pass therethrough are formed. The through-holes 20a are formed at positions that correspond to the through-holes 15a at the time when the module 1M is fixed to the frame 8. Therefore, as shown in FIG. 4, the through-holes 20a are formed at predetermined positions in the horizontal plate portion 20 along the longitudinal direction of the frame 8.

Since the frame 8 is a long member, when the module 1M is to be fixed to the frame 8, positional displacement could occur between each through-hole 15a of the bottom plate 15 and the corresponding through-hole 20a of the horizontal plate portion 20. Therefore, the hole diameter of the through-hole 15a of the bottom plate 15 and the hole diameter of the through-hole 20a of the horizontal plate portion 20 are set to dimensions obtained by adding a play length to the shank diameter of the shank portion 31 of the rivet 30, in order to inhibit the positional displacement. Associated with this, the dimensional tolerance of the inner diameter of the washer 40 is set to be within a dimensional tolerance (here, 0.1 mm)

necessary for caulking and fixing the enlarged diameter portion 33 to the washer 40, with respect to the shank diameter of the shank portion 31 of the rivet 30.

<Grounding Structure of Bottom Plate>

As described above, the bottom plate 15 is formed from metal. In addition, the rivet 30, the washer 40, and the frame 8 are each formed from an electric conductor, and the frame 8 is electrically connected to the ground line (not shown) of the photovoltaic apparatus 100.

Thus, as shown in FIG. 5, by being in contact with the frame 8 and the bottom plate 15, the rivet 30 and the washer 40 electrically connect the frame 8 and the bottom plate 15. Accordingly, the bottom plate 15 is connected to the ground line of the photovoltaic apparatus 100, through the washer 40, the shank portion 31, the head 32, and the frame 8.

Since the rust prevention film 17 is formed at the outer face 15c of the bottom plate 15, there are cases where electric current is difficult to flow due to the presence of the rust prevention film 17 even when the horizontal plate portion 20 of the frame 8 and the outer face 15c of the bottom plate 15 are in contact with each other.

In this regard, in the present embodiment, since the frame 8 and the bottom plate 15 are electrically connected by the rivet 30 and the washer 40, continuity can be sufficiently ensured even in a state where the rust prevention film 17 is present between the horizontal plate portion 20 and the bottom plate 15.

Thus, since the rivet 30 and the washer 40 of the present embodiment are each an electric conductor, the rivet 30 and the washer 40 serve as a path for electric connection from the bottom plate 15 to the frame 8. Accordingly, grounding necessary for the module 1M is ensured. At this time, the resistance-to-ground of the bottom plate 15 is set to 0.1Ω or lower.

It should be noted that, as the grounding structure for the bottom plate 15, a conductor line dedicated for grounding may be employed as in the conventional example described above.

<Recessed Portion>

The shank portion 31 of the rivet 30 is inserted into the through-hole 20a and the through-hole 15a from the lower side of the horizontal plate portion 20 of the frame 8, and is passed through the horizontal plate portion 20 and the bottom plate 15 and inserted into the washer 40.

A recessed portion 25, which is recessed to the inner side (right side in FIG. 5) of the housing 11, is formed in an end portion at the bottom plate 15 side of the side wall frame 16, and the washer 40 is disposed in the recessed portion 25.

Figure 6:
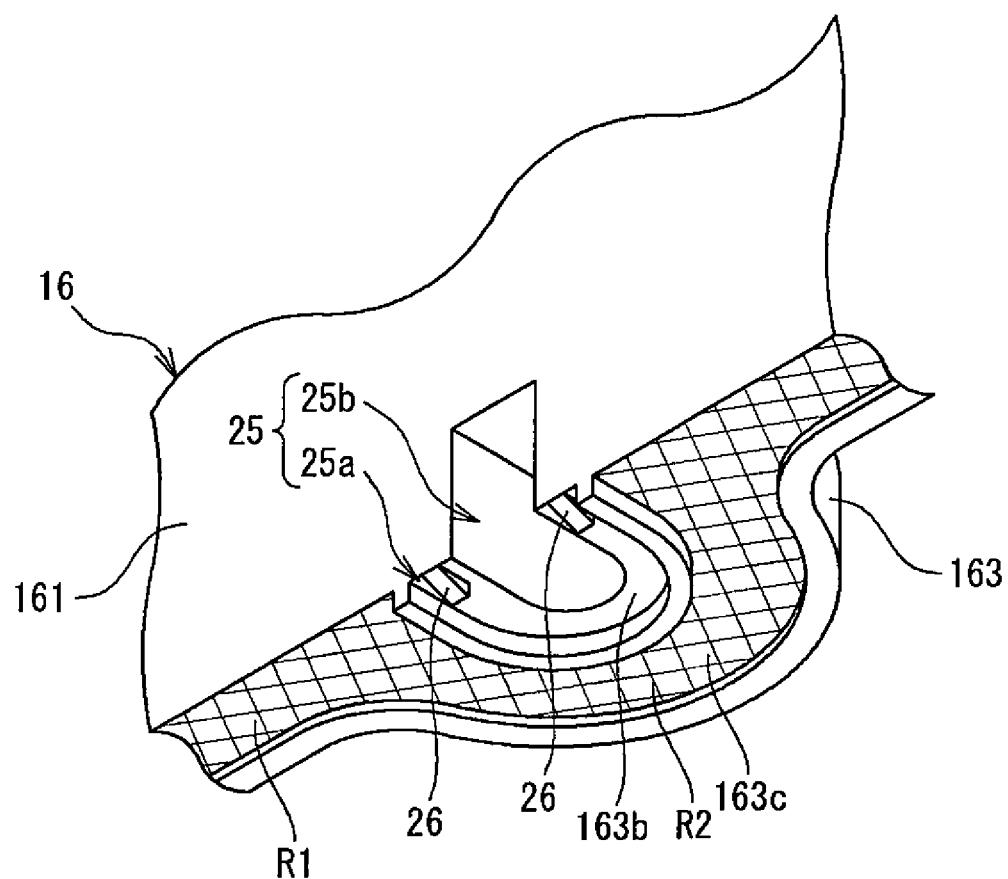
FIG. 6 is a perspective view of a recessed portion shown in FIG. 5, viewed from below.

FIG. 6 is a perspective view of the recessed portion 25 shown in FIG. 5, viewed from below.

In FIG. 5 and FIG. 6, the recessed portion 25 is formed integrally with the side wall frame 16, and is provided at each of four corners of the housing 11 so as to correspond to the through-holes 15a of the bottom plate 15.

The recessed portion 25 is formed so as to be recessed to the inner side of the housing 11 with respect to an inner face 16b of the side wall frame 16, such that the predetermined portion (the place where the washer 40 is disposed) in the inner face 15b of the bottom plate 15 is located at the outer side of the side wall frame 16.

Specifically, a side wall body portion 161, a horizontal wall portion 162 extending from the side wall body portion 161 to the inner side of the housing 11, and a vertical wall portion 163 extending from an inner end portion of the horizontal wall portion 162 to the bottom plate 15 side are integrally formed to constitute the side wall frame 16. The recessed portion 25 is partitioned by the horizontal wall portion 162, the vertical wall portion 163, and the bottom plate 15. In the present embodiment, the horizontal wall portion 162 is formed in a semicircular plate shape, and the vertical wall portion 163 is formed in a semicylindrical shape.

The recessed portion 25 is open to the vertical plate portion 21 side of the frame 8, and allows the washer 40 to be inserted into the recessed portion 25 from the opening when the module 1M is to be fixed to the frame 8.

The recessed portion 25 includes: a first accommodation portion 25a in which the washer 40 is accommodated; and a second accommodation portion 25b in which the portion, of the shank portion 31 of the rivet 30, that protrudes with respect to the washer 40 (the enlarged diameter portion 33 in FIG. 5) is accommodated.

The first accommodation portion 25a is formed, at a lower face 163a of the vertical wall portion 163, between a step face 163b formed in a U-shape, for example, and the inner face 15b of the bottom plate 15. The step face 163b restricts upward movement of the washer 40 when the shank portion 31 is inserted from the lower side of the washer 40, if the upper face of the washer 40 accommodated in the first accommodation portion 25a comes into contact with the step face 163b.

At the opening side (the vertical plate portion 21 side) of the step face 163b, a pair of restriction portions 26 protruding to the bottom plate 15 side is formed integrally with the step face 163b. The protruding end face of each restriction portion 26 is a tapered face 26a in which the protruding height thereof is gradually increased from the opening of the first accommodation portion 25a toward the depth side. The side face at the depth side of the restriction portion 26 is a restriction face 26b formed so as to be perpendicular to the step face 163b.

Accordingly, when the washer 40 is pushed in from the opening of the first accommodation portion 25a to the depth side along the tapered faces 26a of the restriction portions 26, the washer 40 goes over the restriction portions 26 to be accommodated in the first accommodation portion 25a. Then, the washer 40 accommodated in the first accommodation portion 25a comes into contact with the restriction faces 26b of the restriction portions 26, whereby the washer 40 is restricted from falling off from the opening of the first accommodation portion 25a to the outer side.

The restriction portions 26 may be provided to the inner face 15b of the bottom plate 15 opposed to the step face 163b.

The dimension in the depth direction (the left-right direction in FIG. 5) of the first accommodation portion 25a is set to be a dimension that allows positional adjustment in the depth direction of the washer 40 accommodated to the depth side with respect to the restriction portions 26. Accordingly, when the shank portion 31 of the rivet 30 is inserted into the washer 40, the shank portion 31 can be assuredly inserted into the washer 40 through positional adjustment of the washer 40 in the depth direction of the first accommodation portion 25a.

The second accommodation portion 25b is formed at the horizontal wall portion 162 side with respect to the first accommodation portion 25a. The second accommodation portion 25b is formed in a size that does not hinder, when the shank portion 31 is inserted into the washer 40 and deformed so as to have an enlarged diameter, the insertion and the enlarged diameter deformation (see FIG. 7 to FIG. 9).

In the present embodiment, the recessed portion 25 which accommodates the washer 40 and the portion, of the shank portion 31, that protrudes with respect to the washer 40 is formed at the side wall frame 16. However, without forming the recessed portion 25, the outer edge of the bottom plate 15 may be extended to the outer side with respect to the side wall frame 16, and the washer 40 and the like may be disposed at the extended portion. In this case, the bottom plate 15 may be fastened to the horizontal plate portion 20 with the washer 40 disposed on the lower face 20c of the horizontal plate portion 20 and with the head 32 of the rivet 30 disposed on the inner face 15b of the bottom plate 15.

<Seal Layer>

In FIG. 5 and FIG. 6, the vertical wall portion 163 of the side wall frame 16 is bonded and fixed to the inner face 15b of the bottom plate 15, by means of a sealing agent that bonds and fixes the bottom plate 15 and the portion other than the recessed portion 25 of the side wall frame 16 to each other.

A region R1 and a region R2 indicated with cross hatching in FIG. 6 are regions to which the sealing agent is applied between the bottom plate 15 and the side wall frame 16 including the recessed portion 25.

The region R1 is a region in which the sealing agent is applied, in a region where the end face of the side wall frame 16 and the inner face 15b of the bottom plate 15 are in contact with each other. As a result of the sealing agent being applied in the region R1, the bottom plate 15 and the side wall frame 16 are bonded and fixed to each other.

The region R2 is a region in which the sealing agent is applied between the lower face 163a of the vertical wall portion 163 forming the recessed portion 25 and the inner face 15b of the bottom plate 15. Specifically, as shown in FIG. 5, the region R2 is a region partitioned by the inner face 15b of the bottom plate 15 and a recess 163c formed in the lower face 163a of the vertical wall portion 163, at the inner side of the housing 11 with respect to the step face 163b.

The region R2 has both ends thereof connected to the region R1, and surrounds the recessed portion 25 into which the shank portion 31 of the rivet 30 is inserted, along the recess 163c of the vertical wall portion 163. Thus, the sealing agent is applied to the lower face 163a of the vertical wall portion 163, such that the recessed portion 25 is isolated from the inside of the housing 11.

As shown in FIG. 5, in the portion in which the sealing agent is applied between the vertical wall portion 163 and the bottom plate 15, a seal layer 29 formed by the applied sealing agent is formed. The seal layer 29 bonds and fixes the vertical wall portion 163 and the bottom plate 15 to each other, and closes the space between the vertical wall portion 163 and the bottom plate 15, thereby sealing the inside of the housing 11 from the outside.

Accordingly, water and dust can be prevented from entering the inside of the housing 11 from the recessed portion 25 formed at the outer side of the side wall frame 16.

In FIG. 5, the portion in which the sealing agent is applied between the vertical wall portion 163 and the bottom plate 15 is shown. However, also between the bottom plate 15 to which the sealing agent is applied, bonded, and fixed, and the side wall frame 16 in which the recessed portion 25 is not formed, a seal layer formed by the sealing agent is formed in a similar manner.

The seal layer seals the joining portion between the bottom plate 15 and the side wall frame 16 and prevents water and dust from entering the inside of the housing 11 from the joining portion.

<Mounting Procedure of Module>

The module 1M having the above configuration is fixed to a pair of the frames 8 in the following procedure.

First, the module 1M is disposed between a pair of the frames 8, and the through-holes 15a formed at four corners of the bottom plate 15 of the module 1M and the through-holes 20a formed in the horizontal plate portion 20 of the frames 8 are aligned with each other.

Next, the washer 40 is inserted into the recessed portion 25 from the outer side of the side wall frame 16 of the housing 11. At this time, the washer 40 is pushed in to the depth side along the tapered faces 26a of the restriction portions 26 from the opening of the first accommodation portion 25a, whereby the washer 40 goes over the restriction portions 26 to be accommodated in the first accommodation portion 25a. Accordingly, the washer 40 is disposed in a movable manner in the depth direction along the inner face 15b of the bottom plate 15 in the first accommodation portion 25a, and is restricted from falling off to the outer side from the opening of the first accommodation portion 25a by the restriction faces 26b of the restriction portions 26.

The washer 40 may be inserted into the recessed portion 25 in advance before the module 1M is disposed between the pair of the frames 8.

Next, a mandrel 34 (see FIG. 7) having a round bar shape is inserted into the shank portion 31 of the rivet 30 from the upper end side thereof, and a head portion 34a formed at an upper end portion of the mandrel 34 is brought into contact with the leading end face of the shank portion 31. Then, as shown in FIG. 7, the shank portion 31 is inserted, from the lower side of the horizontal plate portion 20 of the frame 8, into the through-hole 20a, the through-hole 15a, and the washer 40 accommodated in the recessed portion 25 of the housing 11. At this time, the outer diameter dimension of the head portion 34a is set to be the same value as that of the outer diameter dimension of the shank portion 31, and thus, the head portion 34a is also inserted into the through-holes 20a, 15a and the washer 40, together with the shank portion 31. Accordingly, the leading end portion, of the shank portion 31, that protrudes above the washer 40, and the head portion 34a are disposed in the recessed portion 25.

When the shank portion 31 and the head portion 34a are inserted into the washer 40, the upward movement of the washer 40 is restricted by the washer 40 coming into contact with the step face 163b. In addition, positional adjustment of the washer 40 can be performed by moving the washer 40 in the depth direction of the recessed portion 25. Accordingly, the shank portion 31 and the head portion 34a can be easily inserted into the washer 40.

Next, a lower end portion of the mandrel 34 protruding below the head 32 of the rivet 30 is pulled downward by use of a general-purpose tool (not shown) such as a rivet gun. Then, as shown in FIG. 8, the head portion 34a of the mandrel 34 pulls the leading end portion of the shank portion 31 downward, whereby the leading end portion of the shank portion 31 is pushed against the upper face of the washer 40, while being deformed so as to have an enlarged diameter.

Then, when the lower end portion of the mandrel 34 is further pulled downward with the above-mentioned tool, the leading end portion of the shank portion 31 is further deformed so as to have an enlarged diameter as shown in FIG. 9, whereby the enlarged diameter portion 33 is formed, and this enlarged diameter portion 33 is caulked to be fixed to the washer 40. In this state, when the lower end portion of the mandrel 34 is further pulled downward, a neck portion 34b formed immediately below the head portion 34a of the mandrel 34 is cut. Accordingly, the portion, of the mandrel 34, at the lower side of the neck portion 34b is pulled to the lower side of the rivet 30.

Accordingly, as shown in FIG. 5, the horizontal plate portion 20 of the frame 8 and the bottom plate 15 of the housing 11 are fastened between the head 32 of the rivet 30 and the washer 40. As a result, the bottom plate 15 is fixed to the frame 8, and the bottom plate 15 and the frame 8 are electrically connected to each other through the rivet 30 and the washer 40.

Fixation of each module 1M to a pair of the frames 8 ends when fastening of the bottom plate 15 and the frame 8 by means of the rivet 30 and the washer 40 has been performed at four positions per module 1M as described above.

<Effects>

As described above, in the mounting structure of the module 1M of the present embodiment, the shank portion 31 of the rivet 30, which is passed through the horizontal plate portion 20 of the frame 8 and the bottom plate 15 of the housing 11 and inserted into the washer 40, is deformed so as to have an enlarged diameter by use of a general-purpose tool. As a result, the horizontal plate portion 20 and the bottom plate 15 can be sandwiched and fastened between the head 32 of the rivet 30 and the washer 40. Accordingly, the module 1M can be fixed to the frame 8. Thus, unlike the conventional example mentioned above, it is not necessary to manage the fastening torque of bolts that fix the module, and the mounting work of the module 1M to the photovoltaic apparatus 100 can be facilitated.

In addition, if the module 1M is fixed to the horizontal plate portion 20 of the frame 8 by use of the rivet 30 and the washer 40, the rivet 30 and the washer 40 serve as the path for electrical connection from the bottom plate 15 to the frame 8 at the same time. Accordingly, grounding for the bottom plate 15 can also be ensured. Thus, unlike the conventional example mentioned above, it is not necessary to perform work of connecting a conductor line for providing grounding after the module 1M is fixed, and thus, the mounting work of the module 1M to the photovoltaic apparatus 100 can be further facilitated.

The through-holes 15a, 20a of the bottom plate 15 and the horizontal plate portion 20 are each formed so as to have a hole diameter that allows the shank portion 31 of the rivet 30 to be inserted with a play. Thus, there are cases where the position at which the shank portion 31 having been passed through the through-holes 15a, 20a is inserted into the washer 40 at the inner face 15b side of the bottom plate 15 is displaced. However, even in such a case, if positional adjustment of the washer 40 is performed at the inner face 15b of the bottom plate 15, the shank portion 31 can be assuredly inserted into the washer 40.

The washer 40 is disposed at a predetermined portion in the inner face 15b of the bottom plate 15, and at an end portion at the bottom plate 15 side of the side wall frame 16, the recessed portion 25 recessed to the inner side of the housing 11 is formed such that the predetermined portion is located at the outer side of the side wall frame 16. Thus, when the shank portion 31 of the rivet 30 is deformed so as to have an enlarged diameter, even if the washer 40 is forgotten to be inserted into the shank portion 31, the washer 40 can be easily inserted into the shank portion 31 by inserting the washer 40 to the recessed portion 25 from the outer side of the side wall frame 16. In addition, when the rivet 30 is to be removed from the frame 8, if the head 32 of the rivet 30 is cut by use of an electric drill, for example, the shank portion 31 and the head 32 are separated from each other. Thus, the enlarged diameter portion 33 of the rivet 30 can be easily removed from the recessed portion 25. Then, by use of a new rivet 30, the bottom plate 15 can be fixed to the frame 8, again.

Since the seal layer 29 is formed between the bottom plate 15 and the vertical wall portion 163 of the side wall frame 16, foreign matter such as water, dust, and the like can be inhibited from entering the inside of the housing 11 from the recessed portion 25 formed at the outer side of the side wall frame 16.

If the photovoltaic panel 1 is formed by arranging a plurality of the photovoltaic modules 1M as described above, the photovoltaic panel 1 can realize desired power generation.

The photovoltaic apparatus 100 that includes: the photovoltaic panel 1 as described above; and the driving device 5 which drives the photovoltaic panel 1 so as to perform operation of tracking the movement of the sun while facing the direction of the sun, can always maintain, during daytime, the state where the power generation efficiency is highest at that point in time.

<Others>

The embodiment disclosed herein is merely illustrative and not restrictive in all aspects. The scope of the present disclosure is defined by the scope of the claims rather than the meaning described above, and is intended to include meaning equivalent to the scope of the claims and all modifications within the scope.

For example, in the above embodiment, the photovoltaic module 1M, the photovoltaic panel 1, and the photovoltaic apparatus 100 that are of a concentrator type have been shown as examples, but those of a non-concentrator type in which sun light is directly applied and power generation is performed as in a silicon-based solar battery may be employed, for example.

REFERENCE SIGNS LIST 1 photovoltaic panel
1M photovoltaic module
1U unit
2 pedestal
3 base
4 support portion
6 shaft
7 beam
8 frame
11 housing
11b flange portion
12 flexible printed circuit
12c power generating element
13 concentrating portion
13f Fresnel lens
15 bottom plate
15a through-hole
15b inner face
15c outer face
16 side wall frame
16a outer face
16b inner face
17 rust prevention film
20 horizontal plate portion (support plate)
20a through-hole
20b support face
20c lower face
21 vertical plate portion
25 recessed portion
25a first accommodation portion
25b second accommodation portion
26 restriction portion
26a tapered face 26b restriction face
29 seal layer
30 rivet
31 shank portion
32 head
33 enlarged diameter portion
34 mandrel
34a head portion
34b neck portion
40 washer
100 photovoltaic apparatus
161 side wall body portion
162 horizontal wall portion
163 vertical wall portion
163a lower face
163b step face
163c recess
Ax optical axis
R1 region
R2 region

The invention claimed is:

1. A mounting structure for a photovoltaic module, the photovoltaic module including:
   a plurality of power generating elements; and
   a housing having a metal bottom plate on which the plurality of power generating elements are arrayed, and a resin side wall frame standing along an outer edge of the bottom plate,
the mounting structure comprising:
   a support plate having a support face configured to be in contact with an outer face of the bottom plate to support the photovoltaic module;
   a washer to be disposed on one face which is an inner face of the bottom plate; and
   a rivet having a shank portion and a head, the shank portion being configured to be passed through the support plate and the bottom plate to be inserted into the washer, the head formed at one end portion of the shank portion, the rivet being configured to sandwich and fasten the support plate and the bottom plate between the washer and the head by an other end portion of the shank portion being deformed so as to have an enlarged diameter, wherein
   the washer is disposed at a predetermined portion in the inner face of the bottom plate, and
   the predetermined portion is located at an outer side of the side wall frame.

2. The mounting structure for the photovoltaic module according to claim 1, wherein
   the support plate is an electric conductor that is grounded, and
   the rivet and the washer are each an electric conductor that serves as a path for electrical connection from the bottom plate to the support plate.

3. The mounting structure for the photovoltaic module according to claim 1, wherein
   an end portion at the bottom plate side of the side wall frame forms a recessed portion which is recessed to an inner side of the housing such that the predetermined portion is located at the outer side of the side wall frame.

4. The mounting structure for the photovoltaic module according to claim 3, wherein
   a seal layer for sealing an inside of the housing is formed between the end portion at the bottom plate side of the side wall frame and the bottom plate.

5. A photovoltaic module for which the mounting structure according to claim 1 is used.

6. A photovoltaic panel formed with a plurality of the photovoltaic modules according to claim 5 being arranged.

7. A photovoltaic apparatus comprising:
   the photovoltaic panel according to claim 6; and
   a driving device configured to drive the photovoltaic panel so as to perform operation of tracking movement of the sun while facing a direction of the sun.

* * * * *